United States Patent
Zhang et al.

(10) Patent No.: US 9,866,181 B2
(45) Date of Patent: Jan. 9, 2018

(54) POWER AMPLIFICATION CIRCUIT AND TRANSMITTER

(71) Applicant: Huawei Technologies Co., Ltd., Shenzhen (CN)

(72) Inventors: Xiaomin Zhang, Shenzhen (CN); An Huang, Shenzhen (CN); Liuyan Jiao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/270,954

(22) Filed: Sep. 20, 2016

(65) Prior Publication Data

US 2017/0012587 A1    Jan. 12, 2017

Related U.S. Application Data

(63) Continuation of application No. PCT/CN2014/073883, filed on Mar. 21, 2014.

(51) Int. Cl.
*H03F 3/04* (2006.01)
*H03F 1/32* (2006.01)
(Continued)

(52) U.S. Cl.
CPC ......... *H03F 1/3241* (2013.01); *H03F 1/3205* (2013.01); *H03F 3/193* (2013.01);
(Continued)

(58) Field of Classification Search
CPC .................................. H03F 3/04; H03F 3/191
(Continued)

(56) References Cited

U.S. PATENT DOCUMENTS 6,346,859 B1 * 2/2002 Saitou ..................... H03F 1/565
330/286
6,734,728 B1   5/2004 Leighton et al.
(Continued)

FOREIGN PATENT DOCUMENTS

CN   1701613 A   11/2005
CN   1976023 A    6/2007
(Continued)

OTHER PUBLICATIONS

CN 201480000696.6, Office Action, dated Jul. 19, 2017.

*Primary Examiner* — Henry Choe
(74) *Attorney, Agent, or Firm* — Leydig, Voit & Mayer, Ltd.

(57) ABSTRACT

Embodiments for a power amplifier that can increase a low-frequency resonance frequency are provided. The power amplifier includes a power amplifying transistor die, a first metal oxide semiconductor capacitor, a direct current decoupling capacitor, and an output matching network, where: a drain of the power amplifying transistor die is connected to a first end of the first metal oxide semiconductor capacitor by using a bonding wire, and a second end of the first metal oxide semiconductor capacitor is grounded; the drain of the power amplifying transistor die is directly connected to the output matching network by using a bonding wire; a source of the power amplifying transistor die is grounded; the first end of the first metal oxide semiconductor capacitor is connected to one end of the direct current decoupling capacitor by using a bonding wire; and the other end of the direct current decoupling capacitor is grounded.

8 Claims, 7 Drawing Sheets

(51) Int. Cl.
*H03F 3/193* (2006.01)
*H03F 3/195* (2006.01)
*H03F 3/24* (2006.01)

(52) U.S. Cl.
CPC ............. *H03F 3/195* (2013.01); *H03F 3/245* (2013.01); *H03F 2200/18* (2013.01); *H03F 2200/222* (2013.01); *H03F 2200/387* (2013.01); *H03F 2200/451* (2013.01)

(58) Field of Classification Search
USPC ........................................ 330/296, 285, 302
See application file for complete search history.

(56) References Cited

U.S. PATENT DOCUMENTS

| | | | |
|---|---|---|---|
| 7,378,920 B2* | 5/2008 | Jones | H03F 1/565 333/22 R |
| 7,567,128 B2* | 7/2009 | Oka | H03F 1/56 330/302 |
| 8,299,856 B2 | 10/2012 | Blair | |
| 8,354,882 B2* | 1/2013 | Blednov | H03F 1/0288 330/124 R |
| 8,803,613 B2* | 8/2014 | Mochizuki | H03F 1/565 330/277 |
| 2001/0045867 A1* | 11/2001 | Miyashita | H03F 1/0261 330/302 |
| 2002/0067212 A1* | 6/2002 | Takenaka | H03F 3/601 330/302 |
| 2003/0076173 A1 | 4/2003 | Moller et al. | |
| 2004/0061214 A1 | 4/2004 | Crescenzi, Jr. | |
| 2005/0083118 A1 | 4/2005 | Bakker | |
| 2007/0024358 A1 | 2/2007 | Perugupalli et al. | |
| 2007/0024374 A1 | 2/2007 | Blair et al. | |
| 2009/0128237 A1 | 5/2009 | Attwood et al. | |
| 2010/0200979 A1 | 8/2010 | Blair et al. | |
| 2011/0031571 A1 | 2/2011 | Bouisse | |
| 2011/0308972 A1 | 12/2011 | Streem | |
| 2011/0309872 A1 | 12/2011 | Blair et al. | |
| 2013/0033325 A1 | 2/2013 | Ladhani et al. | |
| 2014/0070365 A1 | 3/2014 | Viswanathan et al. | |

FOREIGN PATENT DOCUMENTS

| | | |
|---|---|---|
| CN | 200976570 Y | 11/2007 |
| CN | 102008014930 A1 | 9/2008 |
| CN | 101699767 A | 4/2010 |
| CN | 101855828 A | 10/2010 |
| CN | 102969986 A | 3/2013 |
| CN | 103326678 A | 9/2013 |
| EP | 1750298 A2 | 2/2007 |
| WO | WO 03065569 A2 | 8/2003 |
| WO | WO 2006016299 A1 | 2/2006 |

\* cited by examiner

POWER AMPLIFICATION CIRCUIT AND TRANSMITTER

CROSS-REFERENCE TO RELATED APPLICATIONS

This application is a continuation of International Application No. PCT/CN2014/073883, filed on Mar. 21, 2014, the disclosure of which is hereby incorporated by reference in its entirety.

TECHNICAL FIELD

The embodiments of the present application relates to the field of communications technologies, and in particular, to a power amplification circuit and a transmitter.

BACKGROUND

A power amplification circuit is an important part of a transmitter in a communications system. As shown in FIG. 1, a power amplification circuit mainly includes three parts: an input matching network, a power amplifying transistor, and an output matching network. An existing power amplifying transistor is shown in FIG. 2. An input matching network and an output matching network are connected in the power amplifying transistor by using pins in the package. A specific internal structure of the power amplifying transistor is shown in FIG. 3, including a power amplifying transistor die (which is generally an active component and is a core part for power amplifying) and a metal oxide semiconductor capacitor (Moscap) that are packaged together. In FIG. 3, LB0, LB1, and LB2 are bonding wires (a bonding wire refers to a metal bonding wire that connects two separate components, and is usually a gold bonding wire or an aluminum bonding wire. The bonding wire is often used inside a device and demonstrates an inductance characteristic at a frequency less than 10 GHz) used to connect separate components. The bonding wire LB0 is specifically used to connect a gate of the power amplifying transistor die and an input pin of the power amplifying transistor. The bonding wire LB1 is specifically used to connect a drain of the power amplifying transistor die and the metal oxide semiconductor capacitor (Moscap). The bonding wire LB2 is specifically used to connect the drain of the power amplifying transistor die and an output pin of the power amplifying transistor.

FIG. 4 is an equivalent circuit of an output end of a power amplification circuit that uses the power amplifying transistor shown in FIG. 3, where Ropt is output resistance of the power amplifying transistor die when the power amplifying transistor die is working, and Cds is a parasitic capacitor between the drain and a source of the power amplifying transistor die. A low-frequency resonant circuit of the output end includes the power amplifying transistor, the output matching network, and a grounded back-end network connected to an output end of the output matching network. A low-frequency resonance frequency is determined by inductance and capacitance in the low-frequency resonant circuit of the output end; if the inductance is relatively large, the low-frequency resonance frequency is relatively low.

However, a relatively low low-frequency resonance frequency of a power amplification circuit in a transmitter is undesirable in many communications networks at present. For example, in a 3G (third generation mobile communications technology) network and a 4G (the fourth generation mobile communications technology) network, modulated signals are all broadband signals, and the modulation signals are transmitted by using a power amplification circuit in a transmitter after being converted into radio frequency signals. To ensure that adjacent channel interference in the networks meets a protocol requirement, DPD (digital predistortion) correction needs to be performed on a radio frequency power amplification circuit If a low-frequency resonance frequency of the power amplification circuit is relatively low, impedance of an envelope signal of a radio frequency signal varies greatly at an output end of the power amplification circuit, which further causes relatively great changes in characteristics of the power amplification circuit at different moments. Based on a DPD correction principle, the relatively great changes in characteristics of the power amplification circuit at different moments cause a relatively poor DPD correction effect, thereby affecting signal bandwidth that can be supported by the power amplification circuit.

Therefore, how to increase a low-frequency resonance frequency of a power amplification circuit becomes an increasingly hot topic in modern technology research.

SUMMARY

Embodiments of the present application provide a power amplification circuit and a transmitter, so as to increase a low-frequency resonance frequency of a power amplification circuit.

According to a first aspect, a power amplification circuit is provided, including a power amplifying transistor die, a first metal oxide semiconductor capacitor, a direct current decoupling capacitor, and an output matching network, where:

a drain of the power amplifying transistor die is connected to a first end of the first metal oxide semiconductor capacitor by using a bonding wire, and a second end of the first metal oxide semiconductor capacitor is grounded;

the drain of the power amplifying transistor die is directly connected to the output matching network by using a bonding wire, and a source of the power amplifying transistor die is grounded;

the first end of the first metal oxide semiconductor capacitor is connected to one end of the direct current decoupling capacitor by using a bonding wire; and the other end of the direct current decoupling capacitor is grounded.

With reference to the first aspect, in a first possible implementation manner, the first end of the first metal oxide semiconductor capacitor is specifically connected, by using the bonding wire, to a microstrip on a printed circuit board on which the power amplification circuit is located, and the microstrip is connected to the one end of the direct current decoupling capacitor.

With reference to the first aspect or the first possible implementation manner of the first aspect, in a second possible implementation manner, the first end of the first metal oxide semiconductor capacitor is specifically connected, by using the bonding wire, to a microstrip that is on the printed circuit board on which the power amplification circuit is located and that is between the first metal oxide semiconductor capacitor and the output matching network.

With reference to the first aspect or the first possible implementation manner of the first aspect, in a third possible implementation manner, the first end of the first metal oxide semiconductor capacitor is specifically connected, by using the bonding wire, to a microstrip that is on the printed circuit board on which the power amplification circuit is located and that is on a side of the first metal oxide semiconductor capacitor.

With reference to the first aspect or the first possible implementation manner of the first aspect, in a fourth possible implementation manner, the first end of the first metal oxide semiconductor capacitor is specifically connected, by using the bonding wire, to a microstrip that is on the printed circuit board on which the power amplification circuit is located and that is on a side of the output matching network.

With reference to the first aspect, the first possible implementation manner of the first aspect, the second possible implementation manner of the first aspect, the third possible implementation manner of the first aspect, or the fourth possible implementation manner of the first aspect, in a fifth possible implementation manner, an input matching network is further included, where a gate of the power amplifying transistor die is directly connected to the input matching network by using a bonding wire.

With reference to the first aspect, the first possible implementation manner of the first aspect, the second possible implementation manner of the first aspect, the third possible implementation manner of the first aspect, the fourth possible implementation manner of the first aspect, or the fifth possible implementation manner of the first aspect, in a sixth possible implementation manner, at least one second metal oxide semiconductor capacitor is further included, where the drain of the power amplifying transistor die is specifically connected directly to the output matching network by using two bonding wires, a connected end between the two bonding wires is connected to a first end of the second metal oxide semiconductor capacitor, and a second end of the second metal oxide semiconductor capacitor is grounded.

With reference to the first aspect, the first possible implementation manner of the first aspect, the second possible implementation manner of the first aspect, the third possible implementation manner of the first aspect, the fourth possible implementation manner of the first aspect, the fifth possible implementation manner of the first aspect, or the sixth possible implementation manner of the first aspect, in a seventh possible implementation manner, the direct current decoupling capacitor is specifically a nanofarad-level capacitor or a microfarad-level capacitor.

According to a second aspect, a transmitter is provided, including any of the foregoing power amplification circuits.

According to the power amplification circuit provided in the first aspect or the transmitter provided in the second aspect, inductance in a low-frequency resonant circuit of an output end of the power amplification circuit is reduced by adding a direct current decoupling capacitor. Therefore, a low-frequency resonance frequency of the power amplification circuit can be increased by using the solutions provided in the embodiments of the present application. Moreover, compared with the prior art, a power amplifying transistor die and a first metal oxide semiconductor capacitor are not packaged, which can help implement more flexible circuit design.

BRIEF DESCRIPTION OF DRAWINGS

The drawings are used to facilitate a further understanding of the present application, and constitute a part of this specification; the drawings, along with the embodiments of the present application, are used to explain the present application, and impose no limitation on the present application. Of the drawings.

DESCRIPTION OF EMBODIMENTS

In order to provide an implementation solution of a more flexibly designed power amplification circuit that can increase a low-frequency resonance frequency, embodiments of the present application provide a power amplification circuit and a transmitter. The following describes exemplary embodiments of the present application with reference to the drawings. It should be understood that the exemplary embodiments described herein are merely used to describe and explain the present application, and are not intended to limit the present application. Moreover, the embodiments in the application and features in the embodiments may be mutually combined provided that there is no conflict.

Embodiment 1

Figure 1:
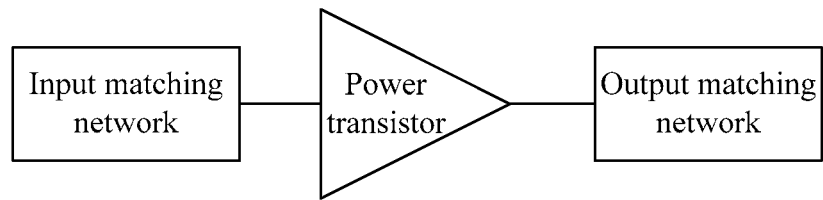
FIG. 1 is a schematic diagram of a power amplification circuit in the prior art.
Figure 2:
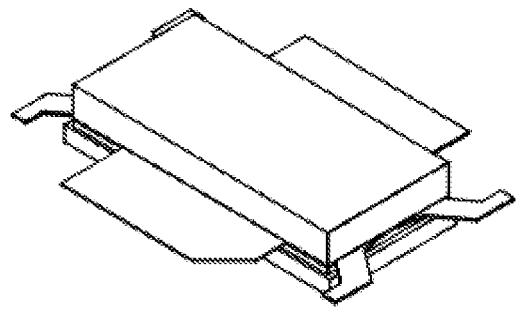
FIG. 2 is a schematic diagram of an appearance of a power amplifying transistor in the prior art.
Figure 3:
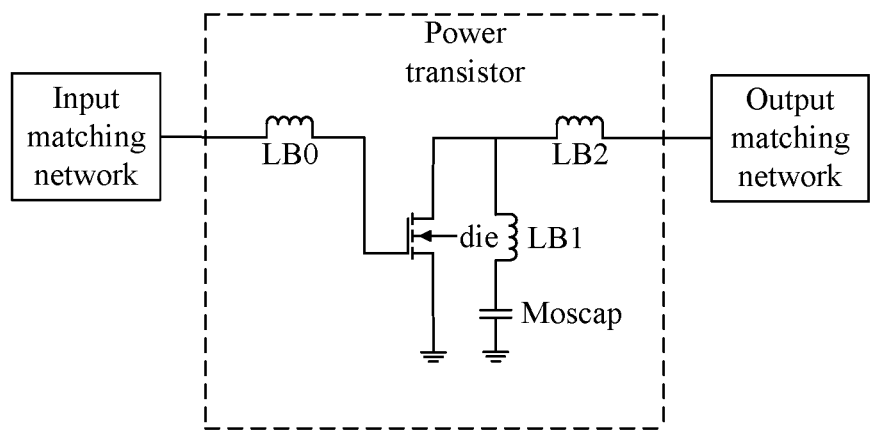
FIG. 3 is a schematic diagram of an internal structure of a power amplifying transistor in the prior art.
Figure 4:
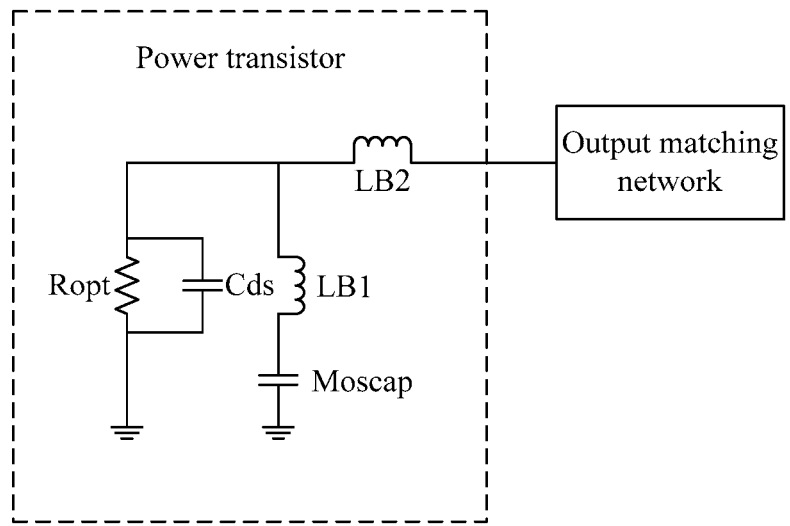
FIG. 4 is a schematic diagram of an equivalent circuit of an output end of a power amplification circuit in the prior art.
Figure 5:
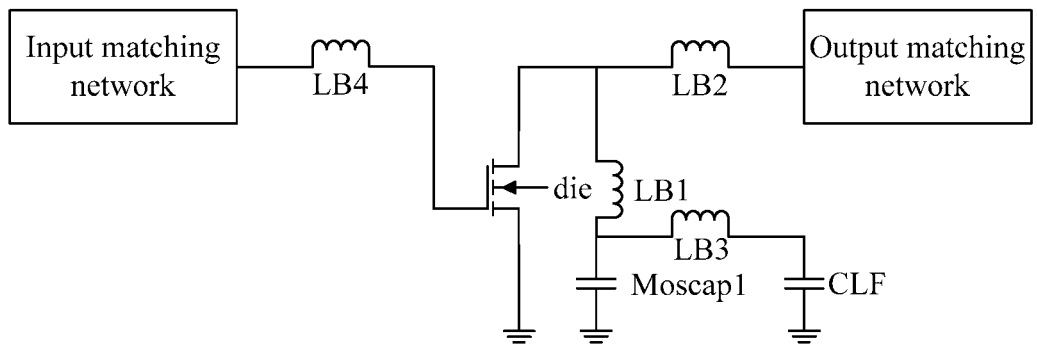
FIG. 5 is a schematic diagram of a power amplification circuit according to Embodiment 1 of the present application.

Embodiment 1 of the present application provides a power amplification circuit. As shown in FIG. 5, the power amplification circuit includes a power amplifying transistor die, a first metal oxide semiconductor capacitor (Moscap1), a direct current decoupling capacitor (CLF), and an output matching network, where:

a drain of the power amplifying transistor die is connected to a first end of the first metal oxide semiconductor capacitor (Moscap1) by using a bonding wire LB1, and a second end of the first metal oxide semiconductor capacitor (Moscap1) is grounded;

the drain of the power amplifying transistor die is directly connected to the output matching network by using a bonding wire LB2, and a source of the power amplifying transistor die is grounded;

the first end of the first metal oxide semiconductor capacitor (Moscap1) is connected to one end of the direct current decoupling capacitor (CLF) by using a bonding wire LB3; and the other end of the direct current decoupling capacitor (CLF) is grounded.

The foregoing direct current decoupling capacitor (CLF) may be a nanofarad-level capacitor, or preferably, may be a microfarad-level capacitor. In an actual application, a larger capacitance value of the direct current decoupling capacitor (CLF) is recommended, and the specific capacitance value can be selected according to a lower bandwidth limit value of an envelope signal of a radio frequency signal. A larger capacitance value of the direct current decoupling capacitor (CLF) is required as the lower bandwidth limit value of the envelope signal of the radio frequency signal decreases.

Further, the power amplification circuit may further include an input matching network, where a gate of the power amplifying transistor die is directly connected to the input matching network by using a bonding wire LB4.

Figure 6:
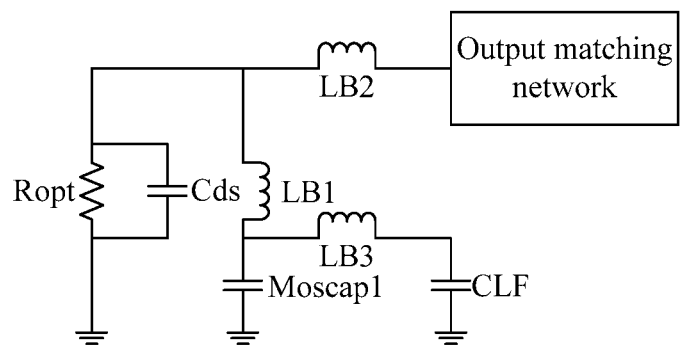
FIG. 6 is a schematic diagram of an equivalent circuit of an output end of a power amplification circuit according to Embodiment 1 of the present application.

FIG. 6 is an equivalent circuit of an output end of the power amplification circuit shown in FIG. 5, where Ropt is output impedance of the power amplifying transistor die when the power amplifying transistor die is working, and Cds is a parasitic capacitor between the drain of the power amplifying transistor die and a source of the power amplifying transistor die.

It can be learned that, compared with the prior art, inductance in a low-frequency resonant circuit of an output end can be reduced by adding a direct current decoupling capacitor (CLF), and therefore a low-frequency resonance frequency of a power amplification circuit can be increased. Moreover, a power amplifying transistor die is directly connected to an output matching network by using a bonding wire, that is, in the power amplification circuit provided in Embodiment 1 of the present application, devices are not packaged, and devices may specifically be selected according to an on-site requirement in an actual application scenario, which implements flexible circuit design, and reduces circuit costs.

The power amplification circuit provided in Embodiment 1 of the present application is applied to a 3G network and a 4G network. By increasing a low-frequency resonance frequency, changes in impedance of an envelope signal can be decreased, that is, a memory effect becomes relatively small. In this way, a DPD correction effect is improved and signal bandwidth of the power amplification circuit is increased.

In specific implementation, the first end of the first metal oxide semiconductor capacitor (Moscap1) in the power amplification circuit provided in Embodiment 1 of the present application may be specifically connected, by using the bonding wire LB3, to a microstrip on a printed circuit board on which the power amplification circuit is located, and the microstrip is connected to one end of the direct current decoupling capacitor (CLF). Therefore, connection between the first metal oxide semiconductor capacitor (Moscap1) and the direct current capacitor (CLF) is formed.

Figure 7:
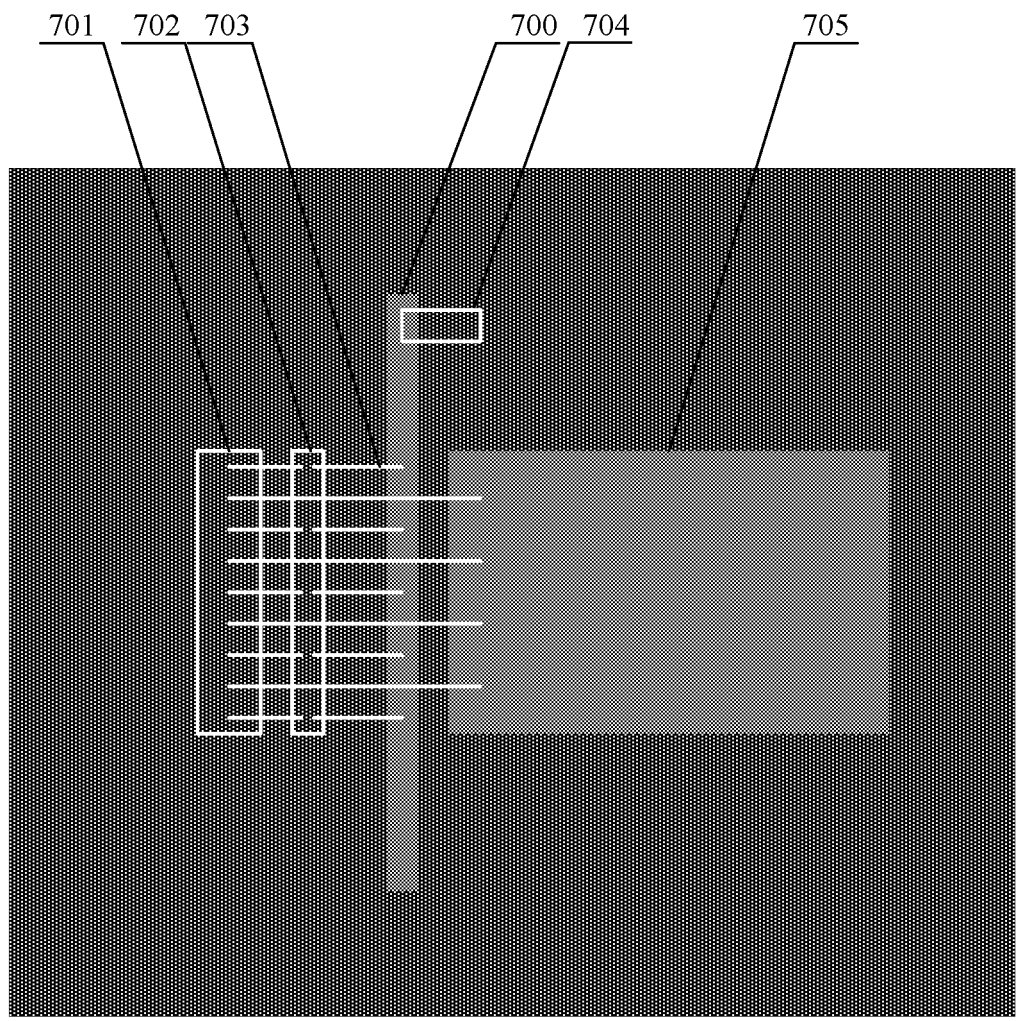
FIG. 7 is a first schematic diagram of a printed circuit board on which a power amplification circuit is located according to Embodiment 1 of the present application.

Specifically, as shown in FIG. 7, 701 is a power amplifying transistor die, 702 is a first metal oxide semiconductor capacitor (Moscap1), 703 is a bonding wire (herein, a first bonding wire, a second bonding wire, and a third bonding wire are not differentiated, and they are all referred to as a bonding wire), 704 is a direct current decoupling capacitor (CLF), and 705 is an output matching network. A first end of the first metal oxide semiconductor capacitor (Moscap1) 702 is specifically connected, by using the bonding wire, to a microstrip 700 that is on the printed circuit board on which the power amplification circuit is located and that is between the first metal oxide semiconductor capacitor (Moscap1) 702 and the output matching network 705, and the microstrip 700 between the first metal oxide semiconductor capacitor (Moscap1) 702 and the output matching network 705 is connected to one end of the direct current decoupling capacitor (CLF) 704.

Figure 8:
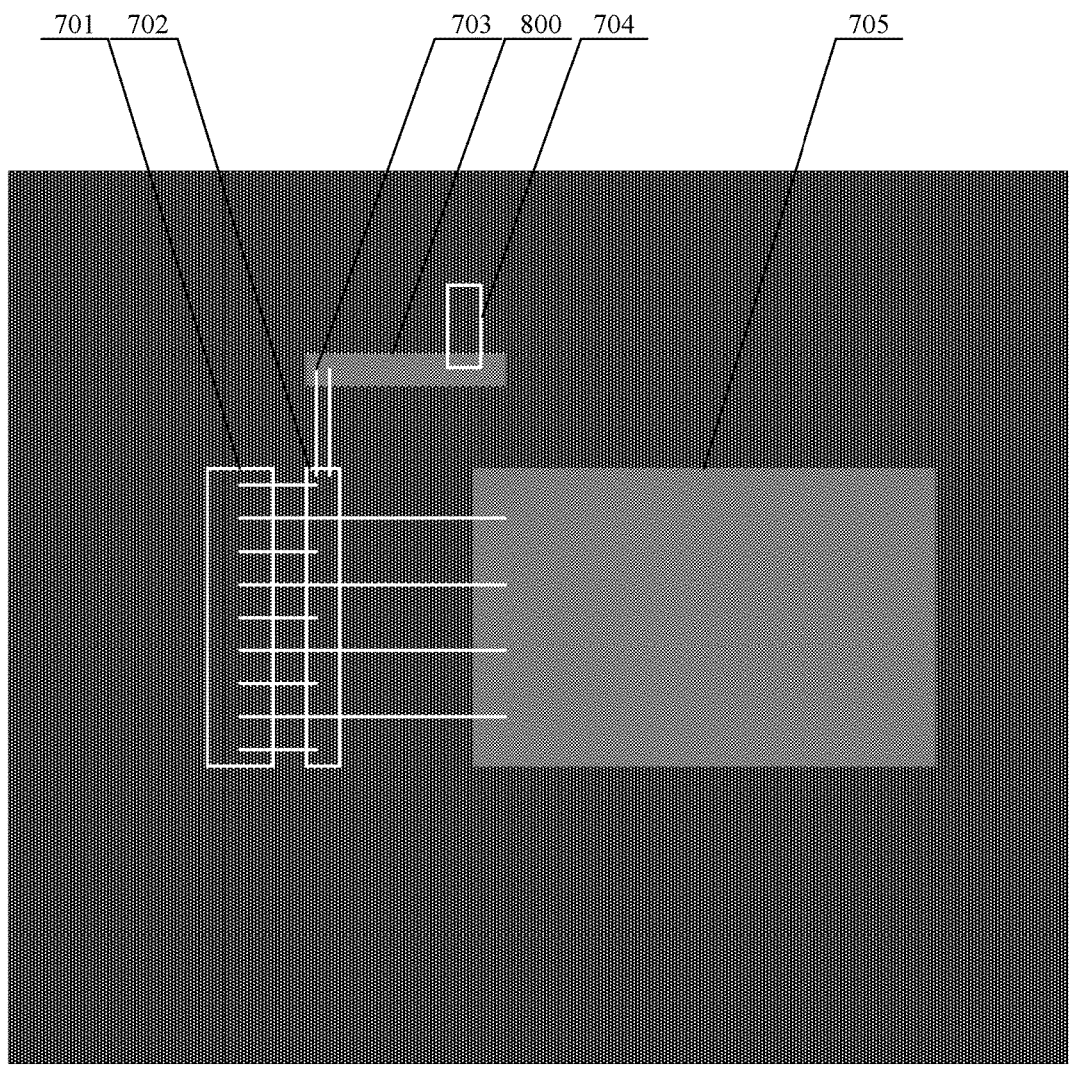
FIG. 8 is a second schematic diagram of a printed circuit board on which a power amplification circuit is located according to Embodiment 1 of the present application.

Specifically, as also shown in FIG. 8, the first end of the first metal oxide semiconductor capacitor (Moscap1) 702 is specifically connected, by using the bonding wire, to a microstrip 800 that is on the printed circuit board on which the power amplification circuit is located and that is on a side of the first metal oxide semiconductor capacitor (Moscap1) 702, where the microstrip 800 on the side of the first metal oxide semiconductor capacitor (Moscap1) 702 is connected to one end of the direct current decoupling capacitor (CLF) 704. In FIG. 8, the microstrip to which the first metal oxide semiconductor capacitor (Moscap1) 702 is connected by using the bonding wire is located above the first metal oxide semiconductor capacitor (Moscap1) 702. In another example, the microstrip to which the first metal oxide semiconductor capacitor (Moscap1) 702 is connected by using the bonding wire may also be located below or on another side of the first metal oxide semiconductor capacitor (Moscap1) 702.

Figure 9:
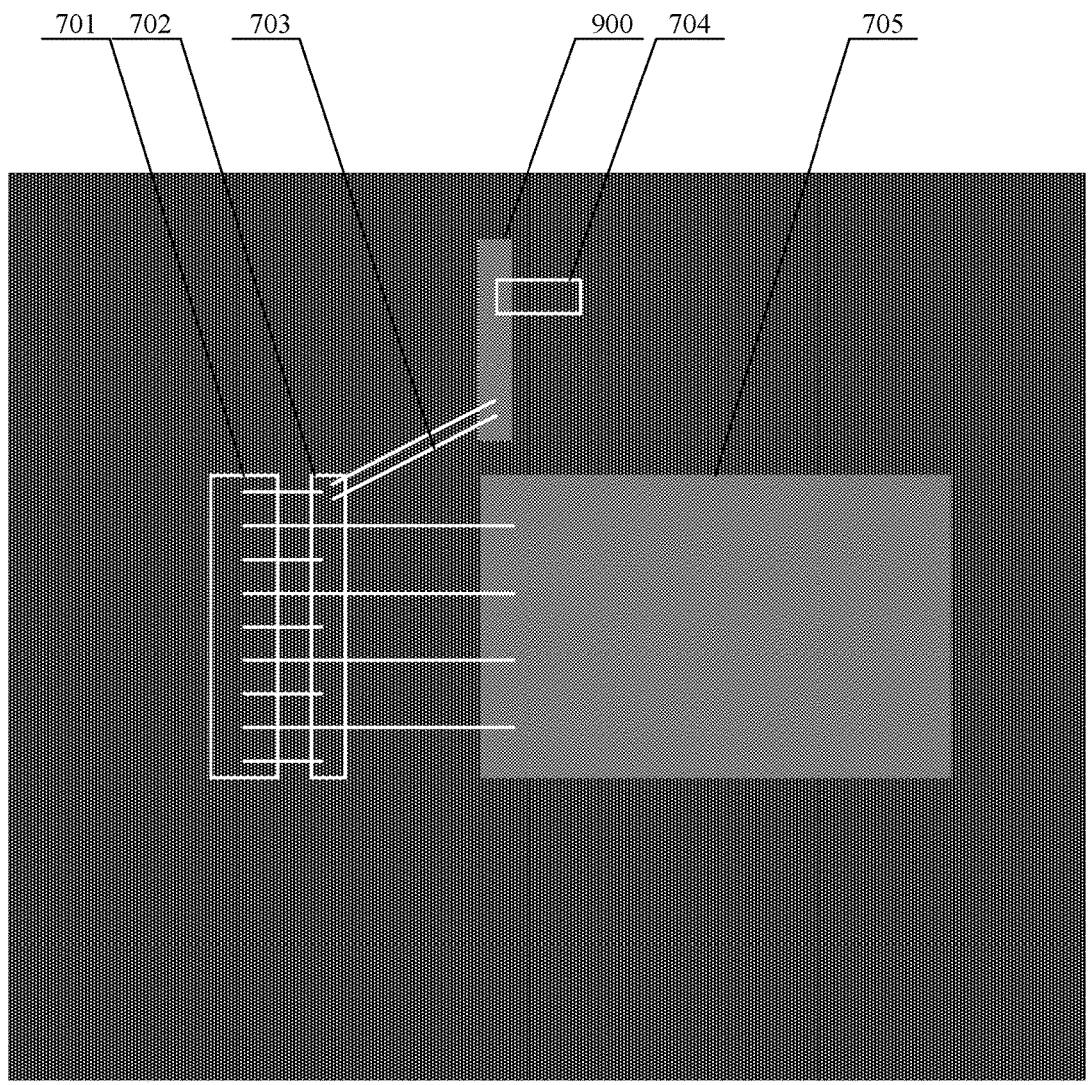
FIG. 9 is a third schematic diagram of a printed circuit board on which a power amplification circuit is located according to Embodiment 1 of the present application.
Figure 10:
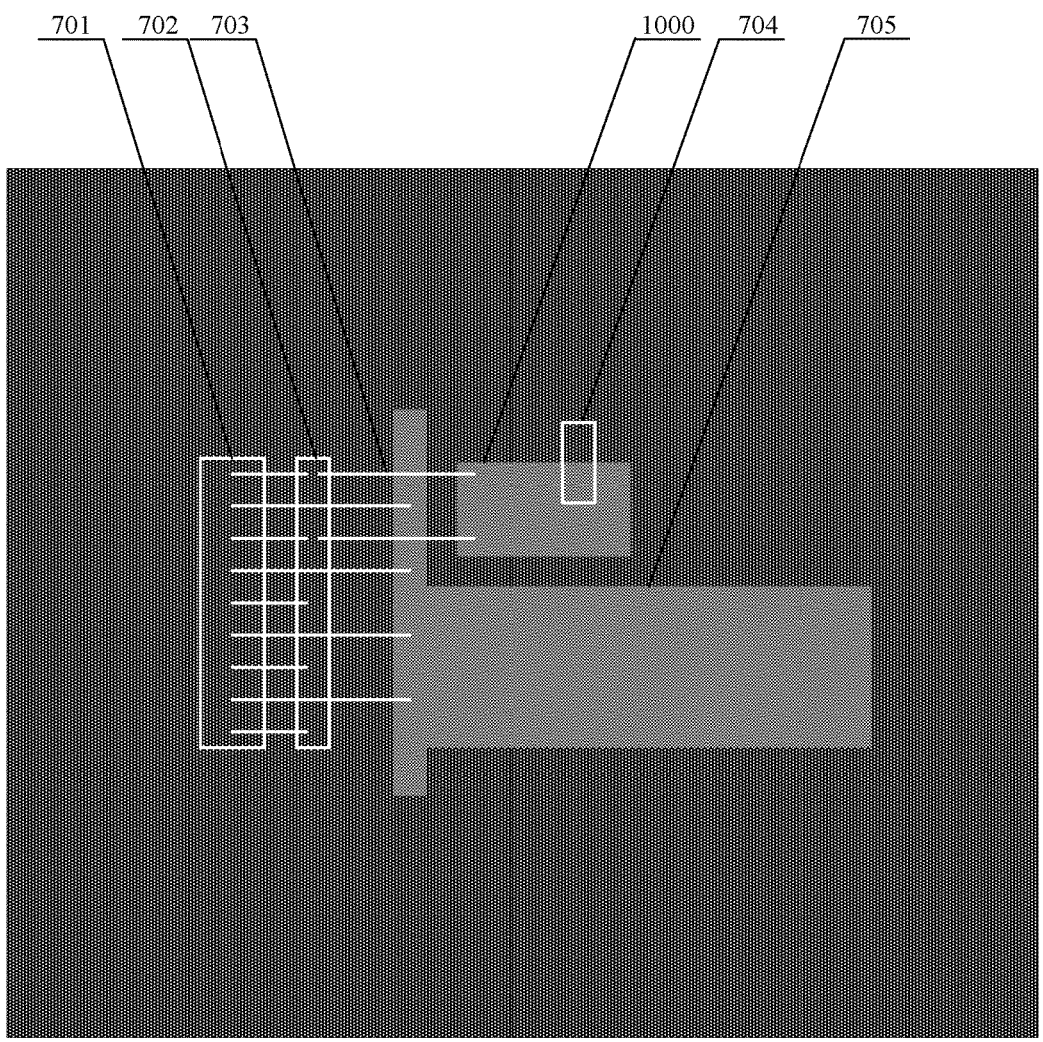
FIG. 10 is a fourth schematic diagram of a printed circuit board on which a power amplification circuit is located according to Embodiment 1 of the present application.

Specifically, as also shown in FIG. 9 or FIG. 10, the first end of the first metal oxide semiconductor capacitor (Moscap1) 702 is specifically connected, by using the bonding wire, to a microstrip (namely, a microstrip 900 in FIG. 9 or a microstrip 1000 in FIG. 10) that is on the printed circuit board on which the power amplification circuit is located and that is on a side of the output matching network 705, and the microstrip on the side of the output matching network 705 is connected to one end of the direct current decoupling capacitor (CLF) 704. In FIG. 9 or FIG. 10, the microstrip to which the first metal oxide semiconductor capacitor (Moscap1) 702 is connected by using the bonding wire is located above the output matching network 705. In another example, the microstrip to which the first metal oxide semiconductor capacitor (Moscap1) 702 is connected by using the bonding wire may also be located below or on another side of the output matching network 705.

Solutions in FIG. 7 to FIG. 10 are merely examples and are not intended to limit the present application. The first end of the first metal oxide semiconductor capacitor (Moscap1) 702 may also be specifically connected, by using the bonding wire, to a microstrip at another position on the printed circuit board on which the power amplification circuit is located, and connection to the direct current decoupling capacitor (CLF) 704 is formed by using a microstrip at another position. That is, consideration may be taken from an aspect of a layout in implementation, and an optimal layout solution may be selected according to an actual situation, to determine a specific scheme for connecting the first metal oxide semiconductor capacitor (Moscap1) 702 and the direct current decoupling capacitor (CLF) 704. Generally, excessively long wiring is not preferable in the layout.

In another embodiment of the present application, for example, the following Embodiment 2, variations may be further made to the power amplification circuit provided in the foregoing Embodiment 1, and shall fall within the protection scope of the present application.

Embodiment 2

Figure 11:
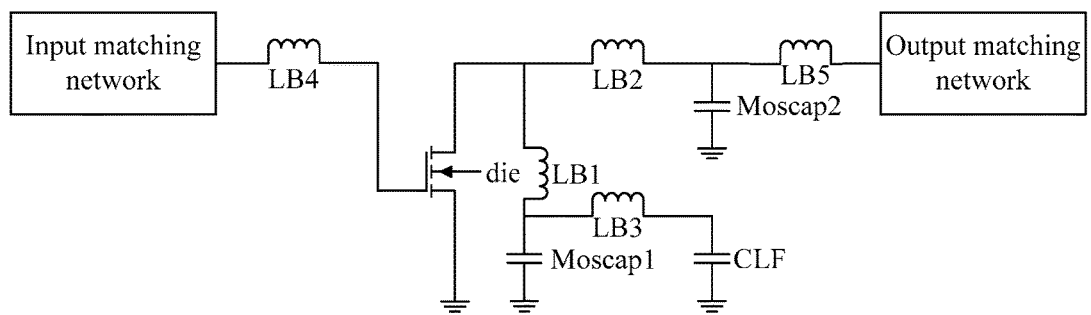
FIG. 11 is a schematic diagram of a power amplification circuit according to Embodiment 2 of the present application.

Embodiment 2 of the present application further provides a power amplification circuit, as shown in FIG. 11, which, compared with the power amplification circuit provided in the foregoing Embodiment 1, further includes a second metal oxide semiconductor capacitor (Moscap2). A drain of a power amplifying transistor die is specifically connected directly to an output matching network by using two bonding wires LB2 and LB5. A connected end between the two bonding wires LB2 and LB5 is connected to a first end of the second metal oxide semiconductor capacitor (Moscap2), and a second end of the second metal oxide semiconductor capacitor (Moscap2) is grounded.

That is, the drain of the power amplifying transistor die is connected to the first end of the second metal oxide semiconductor capacitor (Moscap2) by using the bonding wire LB2, and then the first end of the second metal oxide semiconductor capacitor (Moscap2) is connected to the output matching network by using the bonding wire LB5.

For other specific content, reference may be made to the foregoing Embodiment 1, and details are not described herein again.

It can be learned that, compared with the power amplification circuit provided in the foregoing Embodiment 1, a stage of metal oxide semiconductor capacitor is added to the power amplification circuit provided in Embodiment 2 of the present application, so as to change matched impedance at an output end. In another embodiment of the present application, multiple stages of metal oxide semiconductor capacitors may be further added.

Embodiment 3

Embodiment 3 of the present application further provides a power amplification circuit. Based on the foregoing Embodiment 1 or Embodiment 2, the power amplification circuit may further include a drain bias circuit connected to an output matching network. If the output matching network is not connected to the drain bias circuit, a low-frequency resonant circuit includes a power amplifying transistor die, a metal oxide semiconductor capacitor, a direct current decoupling capacitor, the output matching network, and a grounded back-end network connected to an output end of the output matching network, resulting in relatively long wiring of the low-frequency resonant circuit. If the output matching network is connected to the drain bias circuit, a low-frequency resonant circuit includes a power amplifying transistor die, a metal oxide semiconductor capacitor, a direct current decoupling capacitor, the output matching network, and the drain bias circuit. That is, a wire length of the low-frequency resonant circuit is shortened by using the drain bias circuit, that is, inductance in the low-frequency resonant circuit is further reduced and a low-frequency resonance frequency is increased, which can improve performance of an output end of the power amplification circuit.

The power amplification circuit provided in Embodiment 3 of the present application may further include a gate bias circuit connected to an input matching network, which can improve a performance index of an input end of the power amplification circuit.

Figure 12:
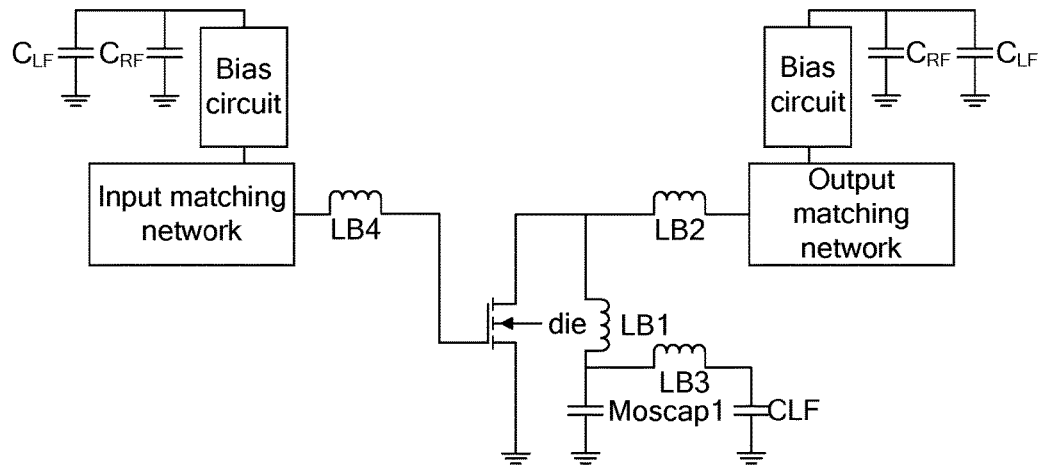
FIG. 12 is a schematic diagram of a power amplification circuit according to Embodiment 3 of the present application.

A power amplification circuit shown in FIG. 12 is a specific example of the power amplification circuit provided in Embodiment 3 of the present application. In two bias circuits, $C_{LF}$ is a direct current decoupling capacitor, and $C_{RF}$ is a radio frequency bypass capacitor.

Embodiment 4

Embodiment 4 of the present application provides a transmitter, including the power amplification circuit shown in any one of the foregoing embodiments.

To sum up, using the solutions provided in the embodiments of the present application can increase a low-frequency resonance frequency of a power amplification circuit, implement flexible circuit design, and achieve relatively low costs.

Persons skilled in the art should understand that, although some preferred embodiments of the present application have been described, the persons skilled in the art can make changes and modifications to these embodiments once they learn the basic inventive concept. Therefore, the following claims are intended to be construed as to cover the preferred embodiments and all changes and modifications falling within the scope of the present application.

Obviously, persons skilled in the art can make various modifications and variations to the embodiments of the present application without departing from the spirit and scope of the embodiments of the present application. The present application is intended to cover these modifications and variations provided that they fall within the scope of protection defined by the following claims and their equivalent technologies.

What is claimed is:

1. A power amplifier, comprising a power amplifying transistor die, a first metal oxide semiconductor capacitor, a direct current decoupling capacitor, and an output matching network, wherein:
   a drain of the power amplifying transistor die is connected to a first end of the first metal oxide semiconductor capacitor by a first bonding wire, and a second end of the first metal oxide semiconductor capacitor is grounded;
   the drain of the power amplifying transistor die is directly connected to the output matching network by a second bonding wire, and a source of the power amplifying transistor die is grounded;
   the first end of the first metal oxide semiconductor capacitor is connected to a first end of the direct current decoupling capacitor by a third bonding wire; and
   a second end of the direct current decoupling capacitor is grounded,
   wherein the first end of the first metal oxide semiconductor capacitor is connected, by the third bonding wire, to a microstrip on a printed circuit board on which the power amplifier is located, and the microstrip is connected to the first end of the direct current decoupling capacitor that is between the first metal oxide semiconductor capacitor and the output matching network.

2. The power amplifier according to claim 1, wherein the first end of the first metal oxide semiconductor capacitor is connected, by the third bonding wire, to the microstrip that is on the printed circuit board on which the power amplifier is located and that is on a side of the first metal oxide semiconductor capacitor.

3. The power amplifier according to claim 1, wherein the first end of the first metal oxide semiconductor capacitor is connected, by the third bonding wire, to the microstrip that is on the printed circuit board on which the power amplifier is located and that is on a side of the output matching network.

4. The power amplifier according to claim 1, further comprising an input matching network, wherein a gate of the power amplifying transistor die is directly connected to the input matching network by a fourth bonding wire.

5. The power amplifier according to claim 1, further comprising a second metal oxide semiconductor capacitor, wherein the drain of the power amplifying transistor die is connected directly to the output matching network by the second bonding wire and a fifth bonding wire, a connected end between the fifth and second bonding wires is connected to a first end of the second metal oxide semiconductor capacitor, and a second end of the second metal oxide semiconductor capacitor is grounded.

6. The power amplifier according to claim 1, wherein the direct current decoupling capacitor is a nanofarad-level capacitor.

7. A transmitter, comprising a power amplifier, wherein:

the power amplifier comprises a power amplifying transistor die, a first metal oxide semiconductor capacitor, a direct current decoupling capacitor, and an output matching network, wherein:

a drain of the power amplifying transistor die is connected to a first end of the first metal oxide semiconductor capacitor by a first bonding wire, and a second end of the first metal oxide semiconductor capacitor is grounded;

the drain of the power amplifying transistor die is directly connected to the output matching network by a second bonding wire, and a source of the power amplifying transistor die is grounded;

the first end of the first metal oxide semiconductor capacitor is connected to a first end of the direct current decoupling capacitor by a third bonding wire; and a second end of the direct current decoupling capacitor is grounded wherein the first end of the first metal oxide semiconductor capacitor is connected, by the third bonding wire, to a microstrip on a printed circuit board on which the power amplifier is located, and the microstrip is connected to the first end of the direct current decoupling capacitor that is between the first metal oxide semiconductor capacitor and the output matching network.

8. The power amplifier according to claim 1, wherein the direct current decoupling capacitor is a microfarad-level capacitor.

* * * * *

UNITED STATES PATENT AND TRADEMARK OFFICE
CERTIFICATE OF CORRECTION

PATENT NO. : 9,866,181 B2
APPLICATION NO. : 15/270954
DATED : January 9, 2018
INVENTOR(S) : Zhang et al.

Page 1 of 1

It is certified that error appears in the above-identified patent and that said Letters Patent is hereby corrected as shown below:

On the Title Page

Page 2, Column 2, Line 21 Foreign Patent Documents, "CN 102008014930A1" should read -- DE 102008014930A1 --.

Signed and Sealed this
Eighth Day of May, 2018

Andrei Iancu
*Director of the United States Patent and Trademark Office*